United States Patent
Dang et al.

(10) Patent No.: US 12,101,612 B2
(45) Date of Patent: Sep. 24, 2024

(54) SMART SPEAKER POWER MANAGEMENT

(71) Applicant: Apple Inc., Cupertino, CA (US)

(72) Inventors: Zhigang Dang, Cupertino, CA (US);
Daniel Naito, Campbell, CA (US);
Evan Thompson, Sunnyvale, CA (US);
Peter Poon, San Jose, CA (US);
Manasi Lagare, Cupertino, CA (US);
Michael Nussbaum, Santa Cruz, CA (US); David Sumberg, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 18/535,433

(22) Filed: Dec. 11, 2023

(65) Prior Publication Data
US 2024/0107229 A1    Mar. 28, 2024

Related U.S. Application Data

(62) Division of application No. 17/111,967, filed on Dec. 4, 2020, now Pat. No. 11,910,171.

(60) Provisional application No. 63/074,652, filed on Sep. 4, 2020.

(51) Int. Cl.
*H04R 3/00* (2006.01)
*H03F 3/183* (2006.01)
*H03G 3/30* (2006.01)

(52) U.S. Cl.
CPC ............. *H04R 3/007* (2013.01); *H03F 3/183* (2013.01); *H03G 3/3005* (2013.01); *H03F 2200/03* (2013.01)

(58) Field of Classification Search
CPC ..... H04R 3/007; H03F 3/183; H03F 2200/03; H03F 1/025; H03F 1/52; H03F 2200/321; H03F 3/181; H03F 3/72; H03G 3/3005; H03G 3/348
See application file for complete search history.

(56) References Cited

U.S. PATENT DOCUMENTS

| | | |
|---|---|---|
| 5,278,994 A | 1/1994 | Black et al. |
| 2008/0186090 A1* | 8/2008 | Wu .......................... H03F 1/305 330/51 |
| 2012/0139348 A1* | 6/2012 | DuBose .................. G06F 1/263 307/80 |
| 2019/0165748 A1* | 5/2019 | Powell ................. H03G 3/3026 |

* cited by examiner

*Primary Examiner* — Yosef K Laekemariam
(74) *Attorney, Agent, or Firm* — FLETCHER YODER PC

(57) ABSTRACT

A smart speaker power controller may be configured to receive power conforming to one of a plurality of power modes from an input power source. The power controller may be further configured to communicate the power mode to at least one component of a processing system or at least one component of an audio system for operating the smart speaker according to the received power mode, including determining a current limit of a power converter; determining a shutdown voltage threshold and safely shutting down the smart speaker if the input voltage falls below the threshold, and/or modifying audio operation of the smart speaker in response to the power mode. The smart speaker can further include an audio power supply controller configured to monitor energy required to reproduce an audio signal and to servo a power supply voltage provided to an audio amplifier in response to this energy level.

19 Claims, 6 Drawing Sheets

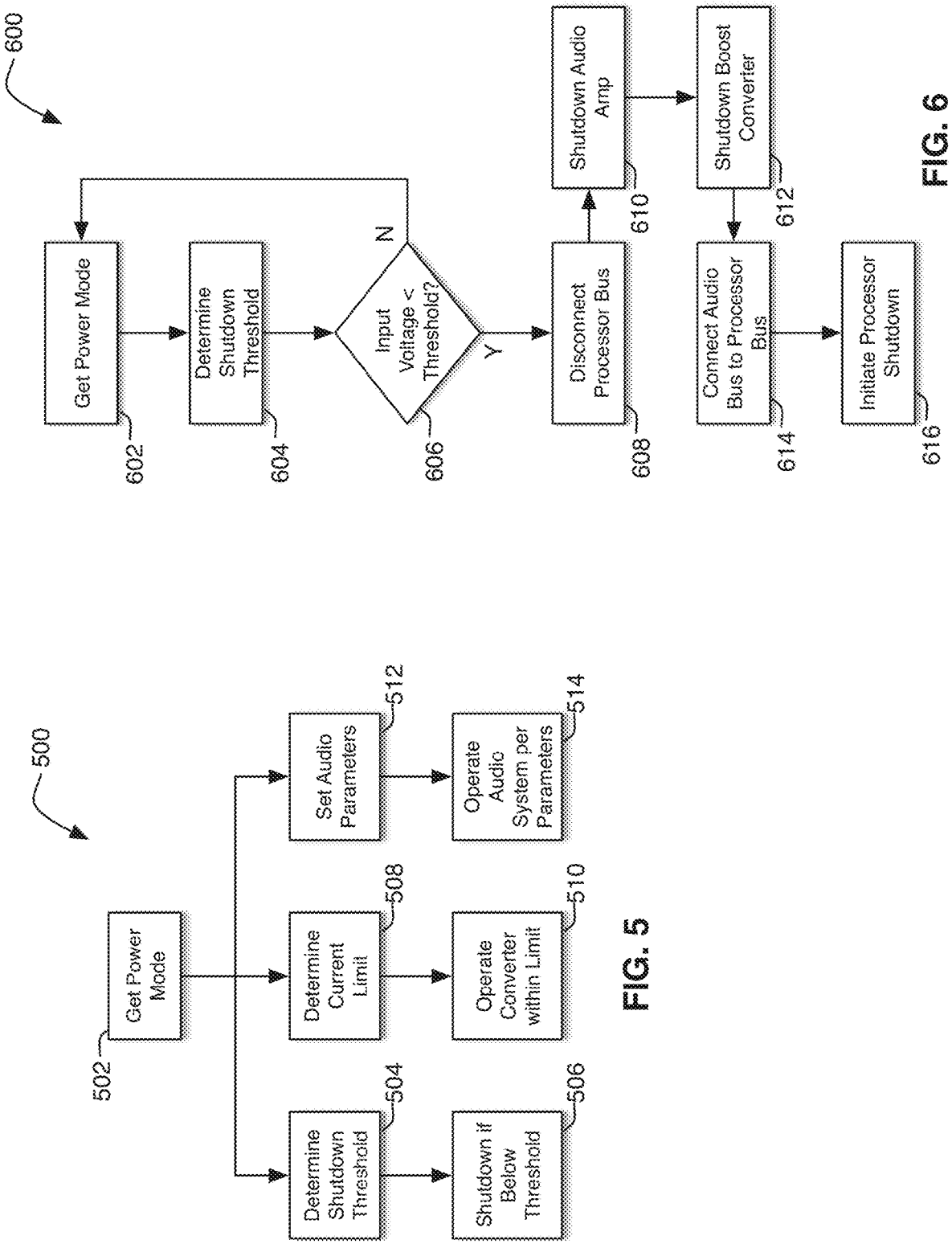

SMART SPEAKER POWER MANAGEMENT

CROSS-REFERENCE TO RELATED APPLICATIONS

This application is a divisional application of U.S. patent application Ser. No. 17/111,967, filed Dec. 4, 2020, entitled "Smart Speaker Power Management", which claims priority to U.S. Provisional Application No. 63/074,652, filed Sep. 4, 2020, entitled "Smart Speaker Power Management," the disclosures of which are incorporated by reference in their entirety for all purposes.

BACKGROUND

Recent consumer electronics trends include the proliferation of "smart" speakers. Generally, these devices include one or more loudspeakers, corresponding audio amplifiers to drive the speakers, and some form of electronic systems that serve as the source of the audio signal. In the simplest embodiments, these devices may be limited to audio playback from a source that is part of the electronic system or a source that is coupled thereto, either by a wired or a wireless connection. Such systems can include, for example, "Bluetooth speakers," which amplify and playback audio from a device such as a media player, mobile phone, tablet computer, laptop computer, etc. that may be coupled to the smart speaker by a wireless Bluetooth link Such systems may also include more complex electronic systems, which are sometimes known as "smart speakers," in which the electronic systems provide network connectivity (either wired or wireless) and may include more sophisticated electronic systems, such as voice-activated digital assistants and the like. For purposes of the description herein a smart speaker can be any device including one or more electronic or computing systems, an audio amplification system, and one or more loudspeakers.

SUMMARY

As smart speaker systems become more prevalent and more sophisticated, it would be desirable to provide improved power management features for such systems that allow for improved operation and user experience.

A smart speaker system can include a power controller, a processing system, and an audio system. The power controller may be configured to receive power from an input power source, and the received power can conform to one of a plurality of power modes. The processing system may be configured to receive power from the power controller via a processing system power bus. The audio system may be configured to receive power from the power controller via an audio system power bus. The power controller may be further configured to communicate the power mode of the incoming power to at least one component of the processing system or at least one component of the audio system.

The power controller may be configured to communicate the power mode to a current limit selector configured to determine a current limit in accordance with the power mode of the incoming power and limit current of a power converter in accordance with the determined current limit. The power converter may be configured to convert input power to power the audio system. The power converter may be a boost converter.

The power controller may alternatively or additionally be configured to communicate the power mode to a shutdown voltage threshold selector configured to determine a shutdown voltage threshold in accordance with the power mode of the incoming power. The shutdown voltage threshold may be provided to a shutdown controller configured to safely shut down the smart speaker if the input power falls below the shutdown voltage threshold. The smart speaker can further include a first switching device configured to selectively couple and decouple the processing system power bus from the input power source and a second switching device configured to selectively couple and decouple the audio system bus to the processing system power bus. The shutdown controller may be configured to open the first switching device responsive to an input voltage below the shutdown voltage threshold, thereby decoupling the processing system power bus from the input power source, and then to close the second switching device, thereby coupling the processing system power bus to the audio system power bus and allowing energy stored in an audio bus capacitor to provide for safe shutdown of the processing system. The shutdown controller may further be configured to perform at least one of the following in response to an input voltage below the shutdown threshold voltage: disabling an audio amplifier of the audio system, disabling a power converter powering the audio system, and/or sending a shutdown signal to the processing system.

The smart speaker may alternatively or additionally be configured so that the power controller is configured to communicate the power mode of the incoming power to the processing system, and the processing system is configured to modify operation of the smart speaker in response to the power mode. The processing system may be further configured to modify operation of the smart speaker in response to the power mode by modifying audio performance of the smart speaker.

A method of operating a smart speaker can include determining a power mode of input power received by the smart speaker, the power mode including an input voltage and at least one of an available current or an available power. The method can further include, responsive to the input power mode, performing at least one of the following: (1) determining a shutdown voltage threshold corresponding to the input power mode and, responsive to an input voltage below the determined shutdown voltage threshold, performing a safe shutdown of the smart speaker; (2) determining a current limit corresponding to the input power mode and limiting a current of a power converter based on the determined current limit; and/or (3) setting one or more audio parameters corresponding to the input power mode and operating an audio system of the smart speaker according to the set audio parameters. Performing a safe shutdown of the smart speaker can include opening a first switching device to decouple a processing system power bus from the input power source and closing a second switching device to couple the processing system power bus to an audio system power bus, thereby allowing energy stored in an audio bus capacitor to provide for safe shutdown of the processing system. Performing a safe shutdown of the smart speaker can further include at least one of: disabling an audio amplifier of the audio system, disabling a power converter powering the audio system, and sending a shutdown signal to the processing system.

In some embodiments, a smart speaker can include a processing system comprising at least one digital signal processor configured to decode an encoded audio file to produce an audio bitstream, at least one digital to analog converter coupled to the at least one digital signal processor and configured to convert the audio bitstream to an analog audio signal, at least one audio amplifier coupled to the at least one digital to analog converter and configured to amplify the analog audio signal, an audio power supply configured to receive an input voltage and provide an output voltage powering the at least one audio amplifier, and an audio power supply controller coupled to the at least one digital signal processor or the at least one digital to analog converter. The audio power supply controller may be further configured to identify an increased or a decreased energy requirement in an upcoming portion of the audio signal. The controller may be further configured to increase a power supply voltage supplied to the at least one audio amplifier responsive to an increased energy requirement in an upcoming portion of the audio signal. The controller may be still further configured to decease the power supply voltage supplied to the at least one audio amplifier responsive to a decreased energy requirement in an upcoming portion of the audio signal. Increasing a power supply voltage supplied to the at least one audio amplifier responsive to an increased energy requirement in an upcoming portion of the audio signal can include beginning the increasing a look ahead time period before the increased energy requirement. Decreasing a power supply voltage supplied to the at least one audio amplifier responsive to a decreased energy requirement in an upcoming portion of the audio signal can include beginning the decreasing a delay time period after the decreased energy requirement.

The audio power supply controller may be configured to receive an audio bitstream from at least one digital signal processor, including a prediction digital signal processor separate from an audio digital signal processor used to decode the encoded audio file. The audio power supply controller may be configured to receive an audio signal from at least one digital to analog converter, including a digital to analog converter separate from a digital to analog converter used to produce the audio signal for the one or more audio amplifiers.

A method of controlling a power supply voltage supplied to an audio amplifier of a smart speaker can include identifying an increased or a decreased energy requirement in an upcoming portion of an audio signal, responsive to an increased energy requirement in an upcoming portion of the audio signal, increasing a power supply voltage supplied to at least one audio amplifier; and responsive to a decreased energy requirement in an upcoming portion of the audio signal, decreasing the power supply voltage supplied to the at least one audio amplifier. Increasing a power supply voltage supplied to the at least one audio amplifier responsive to an increased energy requirement in an upcoming portion of the audio signal can include beginning the increasing a look ahead time period before the increased energy requirement. Decreasing a power supply voltage supplied to the at least one audio amplifier responsive to an decreased energy requirement in an upcoming portion of the audio signal can include beginning the decreasing a delay time period after the decreased energy requirement.

BRIEF DESCRIPTION OF THE DRAWINGS

FIG. 5 illustrates a flow chart of control techniques based on input power mode.

FIG. 6 illustrates a flow chart of extending holdup time achieved by connecting the audio power bus to the processing system power bus to allow for clean shutdown of the system.

DETAILED DESCRIPTION

Figure 1:
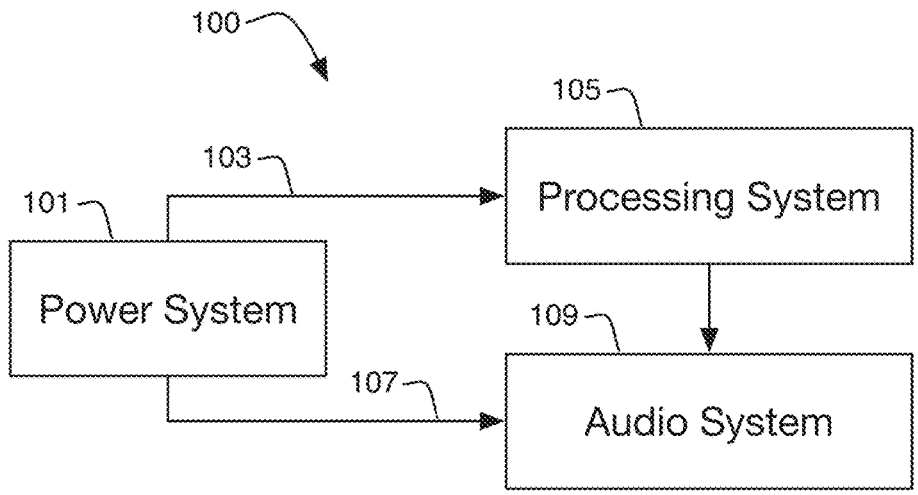
FIG. 1 illustrates a high level block diagram of a smart speaker system.

In the following description, for purposes of explanation, numerous specific details are set forth to provide a thorough understanding of the disclosed concepts. As part of this description, some of this disclosure's drawings represent structures and devices in block diagram form for sake of simplicity. In the interest of clarity, not all features of an actual implementation are described in this disclosure. Moreover, the language used in this disclosure has been selected for readability and instructional purposes, has not been selected to delineate or circumscribe the disclosed subject matter. Rather the appended claims are intended for such purpose.

Various embodiments of the disclosed concepts are illustrated by way of example and not by way of limitation in the accompanying drawings in which like references indicate similar elements. For simplicity and clarity of illustration, where appropriate, reference numerals have been repeated among the different figures to indicate corresponding or analogous elements. In addition, numerous specific details are set forth in order to provide a thorough understanding of the implementations described herein. In other instances, methods, procedures and components have not been described in detail so as not to obscure the related relevant function being described. References to "an," "one," or "another" embodiment in this disclosure are not necessarily to the same or different embodiment, and they mean at least one. A given figure may be used to illustrate the features of more than one embodiment, or more than one species of the disclosure, and not all elements in the figure may be required for a given embodiment or species. A reference number, when provided in a given drawing, refers to the same element throughout the several drawings, though it may not be repeated in every drawing. The drawings are not to scale unless otherwise indicated, and the proportions of certain parts may be exaggerated to better illustrate details and features of the present disclosure.

FIG. 1 illustrates a high level block diagram of a smart speaker 100. The smart speaker 100 can include an audio system 109, which can further include one or more loudspeakers and one or more corresponding amplifiers, as described in greater detail below. The smart speaker system can further include an electronic or computing system 105, which can include any of a variety of electronic devices that, among other functions, provide a signal to the audio system for reproduction thereby. In some embodiments, the electronic system might be a Bluetooth receiver configurable to receive audio from a wirelessly coupled device, such as a media player, smart phone, or the like. In other embodiments, computing system 105 may a more sophisticated system, including network/Internet connectivity, and a mechanism for receiving requests from and providing information to a user. Such systems may be implemented using various embodiments of digital voice assistants, such as Siri (provided by Apple), Alexa (provided by Amazon), Cortana (provided by Microsoft), etc. Further details of the computing system 105 are discussed in greater detail below.

Smart speaker 100 may also include a power system 100 that provides power to the computing system (e.g., via a power bus 103) and to the audio system (e.g., via a power bus 107). Generally, the power system may be configured to receive power from a power source, which may be AC mains power, DC power (such as a battery), or even from a peripheral port of a connected device (such as a USB or Thunderbolt port). Further details of exemplary power systems are discussed in greater detail below.

Figure 2:
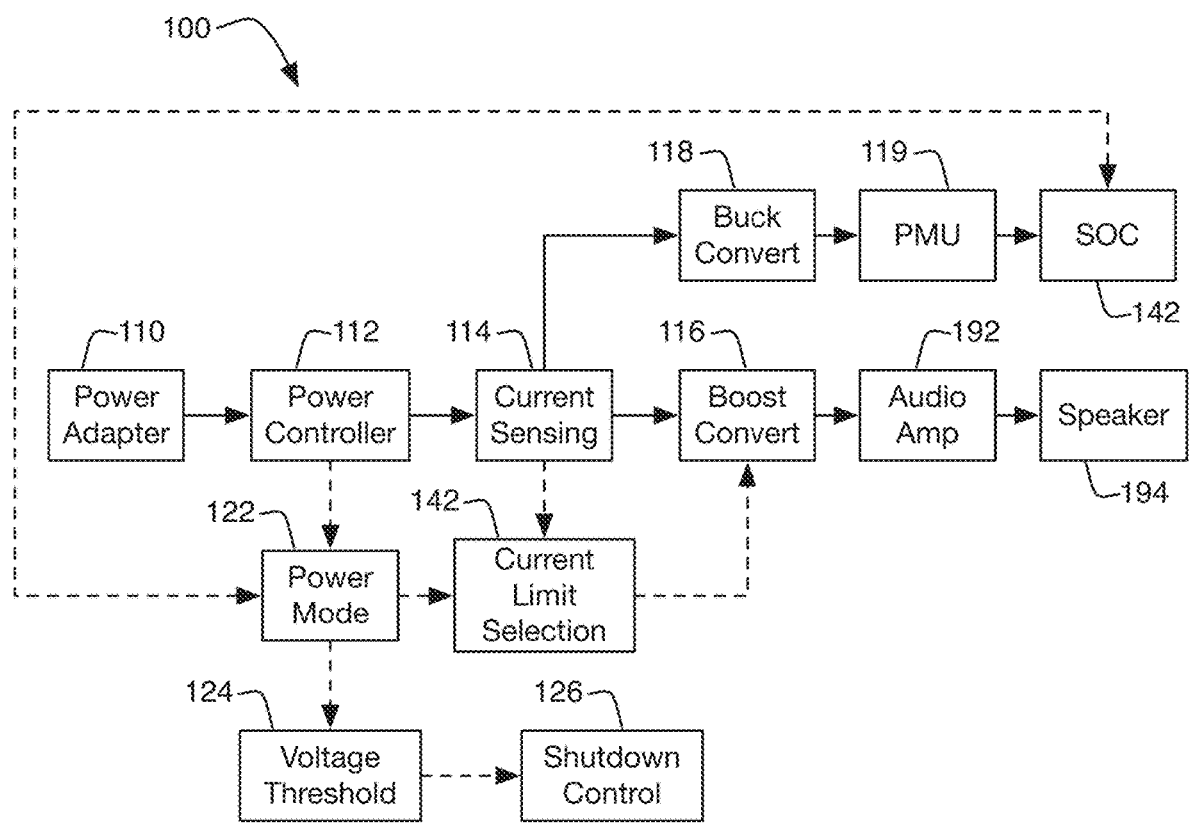
FIG. 2 illustrates an expanded block diagram of a smart speaker system.

FIG. 2 illustrates an expanded block diagram of an exemplary smart speaker with the above-described systems expanded into greater detail. For example, audio system 109 may include an audio amplifier 192 and a speaker 194. In various embodiments, one or more speakers 194 and one or more corresponding audio amplifiers may be provided as desired. Computing system 105 is represented by system on a chip (SoC) 142. Although illustrated and described herein as an SoC, in which various functional modules of a computing or processing system (such as network interfaces, processing, memory, storage, etc.) are integrated into a single semiconductor substrate/package, it is equally possible to implement an electronic/computing/processing system using separate interconnected modules. It is intended that any variation of such systems be included in the scope of the inventive concepts described herein.

The remaining components of smart speaker 100 illustrated in FIG. 2 may be considered as being part of power system 100. As illustrated, the flow of power is indicated by solid arrows, and the flow of data and/or control signals are illustrated by the dashed lines. In the illustrated embodiment, power may be received by power adapter 110. Power adapter 110 may be an AC adapter configured to plug into AC mains power and deliver DC power to power controller 112. Alternatively, power adapter 110 may be an DC adapter configured to receive DC power, e.g., from an automotive accessory port, and deliver DC power (at the same or a different voltage) to power controller 112. In still other embodiments, power adapter 110 could represent a combined power and data interface, such as a USB or Thunderbolt interface, which can also be configured to deliver "bus power" to a connected device. In any of the foregoing embodiments, power adapter 110 may provide power in accordance with the USB-PD (Universal Serial Bus Power Delivery) standard, which can provide for power supply at various voltage and current levels. Other embodiments may provide power according to a different standard or configuration, at any suitable voltage, current, and/or power level.

Power controller 112 may, in some embodiments, be a USB-PD compliant power controller. Such a device may be capable of entering into a negotiation with power adapter 110 to determine the voltage and current level that will be supplied to the system. In other embodiments, power controller 112 may be any suitable device that can detect the characteristics (voltage, current, power) of the supplied power and provide corresponding indications to the various systems, which may be used for operation and control of the smart speaker systems, as described in greater detail below.

After power controller 112, the delivered power may also pass through current sensing module 114, which may be configured to sense the total system current and/or the current delivered to the computing system (e.g., via bus 103) and the current delivered to the audio system (e.g., via bus 107). In the illustrated embodiment, computing system 105 (e.g., SoC 142) may be powered by a buck converter 118 that may reduce the DC voltage received from the power adapter to a lower level suitable for the SoC. As non-limiting examples, in the case of a USB-PD power adapter, the delivered power may be at 5V, 12V, or 20V. The processing system 105 (e.g., SoC 142) may be configured to receive a lower voltage, such as 3.3V, 1.8V, or some other lower voltage. Thus, buck converter 118 may be configured to "buck" the received voltage to this lower level. From buck converter 118, the power may flow to power management unit ("PMU") 119, which may serve as a power manager to control the processing system 105 (e.g., SoC 142) in response to the delivered power. For example, the PMU 119 may be configured to initiate a clean shutdown of SoC 142 when power is no longer available. PMU 119 may also selectively enable/disable various components of processing system 105 as appropriate for the given usage state and load on the system.

Following the other branch out of current sensor 114, power may also be provided to boost converter 116. Boost converter 116 may be configured to boost the input voltage (e.g., the 5V, 9V, 15V, or 20V USB-PD voltage) to a level suitable for powering the audio system 109, specifically audio amplifier(s) 192). Depending on the particulars of the system and desired performance, audio amplifier(s) 192 may be configured to have a nominal power supply voltage of 16V, 24V, 32V, 48V, etc. In most of these embodiments, it may be necessary to boost the input voltage to the rail voltage required by the audio amplifier(s). However, in some embodiments it may be that the input voltage can be the same as the power supply voltage required for audio amplifier(s) 192, in which case boost converter may be provided with a bypass, thereby improving operating efficiency. In still other embodiments, it may be that the input voltage may be even higher, in which case it may be possible to either run the audio amplifier(s) at this higher voltage or boost converter 116 may be a buck-boost converter capable of providing a lower voltage for the audio amplifier power supply. However, it is generally expected that the input voltage will be at or below the preferred power supply voltage of audio amplifier 192. In any case, audio amplifier 192 may take the audio input received from the SoC 142 (for example) and provide a corresponding drive signal to loudspeaker(s) 194 to provide sound audible to a user.

As noted above, power converter 112 may be configured to negotiate with power adapter 110 to provide a particular voltage, current, and/or power level to smart speaker 100. This negotiation may be conducted in accordance with the USB-PD standard or any other suitable mechanism. In some embodiments, the negotiation may include a voltage level that will be supplied by power adapter 110 and a maximum current that can be provided. It will be appreciated that different embodiments of power adapter 110 will be capable of providing different voltages and currents. For example, a relatively high powered AC mains adapter may be capable of providing up to 5 A at 20V (for a total of 100 W). A more moderately powered AC mains adapter may only be capable of providing 1.5 A or 3 A at 12V (for a total of 18 W or 36 W). Similarly, a device such as a laptop computer may only be able to provide 2 A at 5V (for a total of 10 W) via its USB/Thunderbolt port. Thus, power converter 112 may be configured to: (1) negotiate with power adapter 110 to provide a suitable power level to smart speaker 100 and (2) communicate the available power to the various systems of smart speaker 100 in such a way as to provide suitable operation.

In some embodiments, rather than a USB-C based negotiation, power controller 112 may be otherwise configured to negotiate, or, at minimum, determine the available voltage and current. This negotiation or determination may take place in accordance with any suitable industry standard or according to a proprietary technique that may be used only in conjunction with power adapters that are part of the same product ecosystem. In such cases, power controller 112 may be configured to: (1) (optionally) negotiate with power adapter 110 to provide a suitable power level to smart speaker 100; (2) determine (whether by negotiation or otherwise) the characteristics (e.g., voltage and current) of the power supply; and (3) communicate these characteristics to the various systems and/or otherwise control operation of such systems to as to provide suitable operation.

To that end, a power controller 112 may determine a power mode 122. This power mode may include, for example, a provided input voltage and maximum input current. This power mode may be provided to the processing system (e.g., SoC 142), which may use the power mode to set various operating modes as described in greater detail below. The power mode may also be used to select a suitable current limit (142), which may be used to regulate boost converter 116 to prevent the audio system 109 from drawing more power than is available. For example, the current limit may be provided to the control loop of boost converter 116 to prevent the boost converter from drawing more current/power than is available. Finally, the power mode 122 may be used to determine a voltage threshold 124 that may be provided to a shutdown control system 126 that can initiate a clean shutdown of the system if the supplied voltage falls below a suitable threshold, indicating unavailability of suitable power. Further details of these systems and controls are described in greater detail below.

Figure 3:
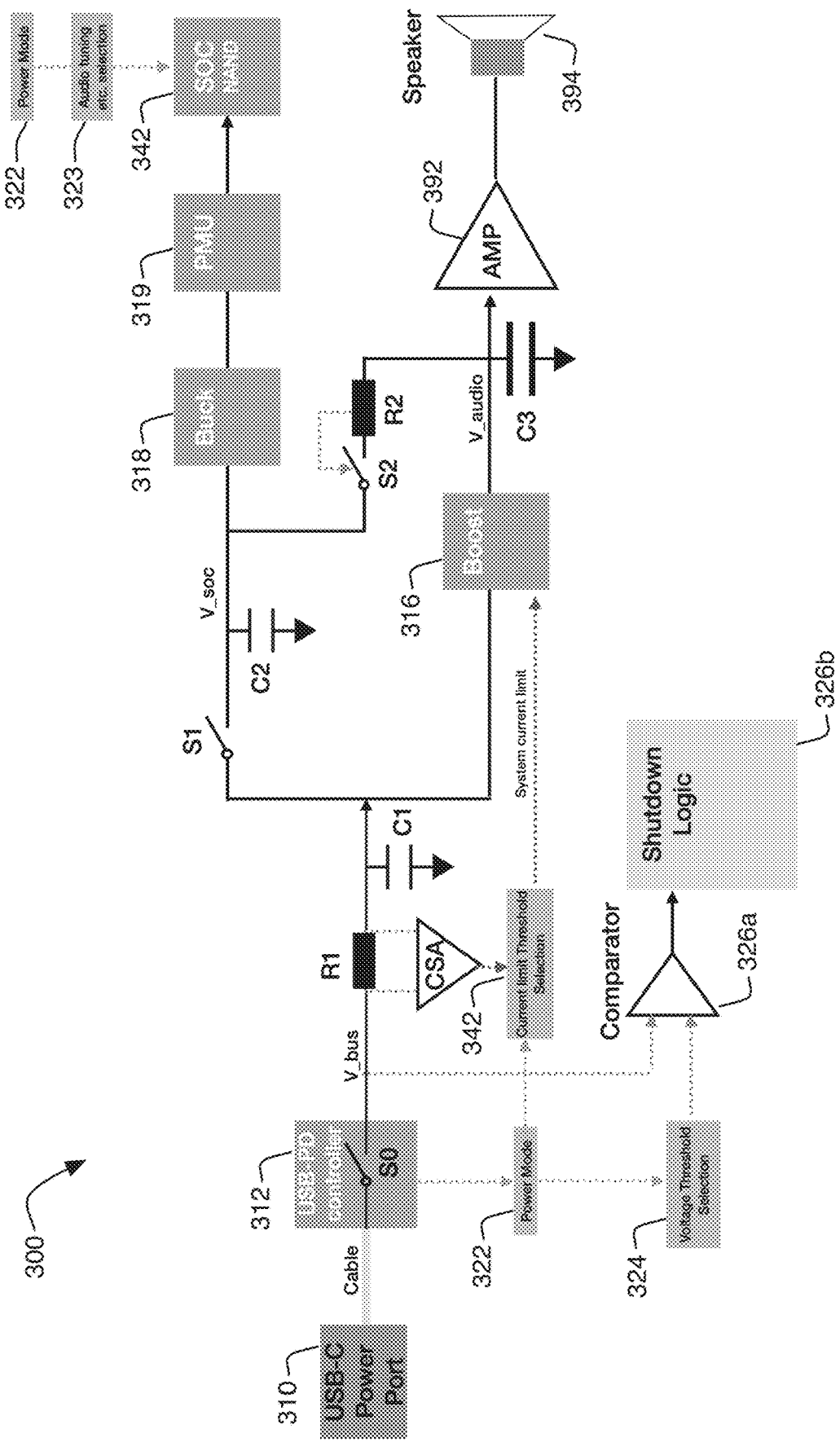
FIG. 3 illustrates an expanded block diagram of a smart speaker system with control based on input power mode.

Turning now to FIG. 3, an expanded version of the block diagram of smart speaker 300 is illustrated. Components in FIG. 3 have reference numerals corresponding to their counterparts in FIG. 2. As described above, a power controller 312, which may be, for example, a USB-PD controller can receive input power from a power source. Additionally, power controller 312 may negotiate with the power source to provide power having certain characteristics that are within the capabilities of the power converter and are most acceptable to the smart speaker 300. Power controller 312 may thus negotiate for a voltage level to be provided, a current level to be provided, and a resulting power level (or, a voltage level, power level, and resulting current level). These various power configurations are described herein as power modes. The power mode 322 may be used for various purposes in the smart speaker system. For example, power mode 322 may be provided to a current limit threshold selection block 342. This may be a portion of the power controller 312, part of a separate controller, or may be implemented by the processing system 342.

Current limit threshold selection block 342 may be used to determine an acceptable system current limit depending on the power mode. In some cases, the power mode provided by the input power source may be a relatively low power source, such as 5V at 2 A, for a power of 10 W. In this case, it may be appropriate to limit the current that boost converter 316 (powering the audio system including audio amplifier(s) 392 and speaker(s) 394) to stay below the 2 A available current. In other cases, when, for example, 12V at 1.5 A are available, a lower current limit (although at a higher power level) may be appropriate. In still other cases, for example when 12V at 3 A is available, a higher current (and significantly higher power level) may be appropriate. In all cases, it may be desirable to have the current limit be less than the maximum available current in the selected/determined/negotiated power mode to allow sufficient power for the processing branch. Thus, depending on the power requirements of the processing system the current limit may be less than the maximum available current corresponding to the power mode.

Current limit threshold selection block 342 may also receive an input from the input current sensing circuitry 114, expanded in FIG. 3 to show an exemplary current sensing arrangement including a current sense resistor R1 and a current sense amplifier CSA. This is but one exemplary current sensing arrangement, and other current sensing arrangements, for example based on Hall effect sensors or other devices, could also be used. This input current sensing arrangement provides a further input to current limit threshold selection block 342 that may be used to provide a suitable current limit to boost converter 316, which powers the audio system. As noted above, other converter topologies besides boost converters could be used as appropriate for a given application.

More specifically, the system current limit signal provided from current limit threshold selection block 342 may be provided to the controller of boost (or other topology) converter 316 so as to limit the amount of current (power) drawn from the input source. Boost converter 316 may be configured to produce a suitable audio bus voltage V_audio (supported by bus capacitor C3) from whatever input voltage is provided. Thus, the voltage gain of boost converter 316 may vary depending on the input voltage. Additionally, the controller/control loop for boost converter 316 (not shown) may be configured with a current limit based on the system current limit signal received from the current limit threshold selection circuit. This current limit may be used to ensure that the boost converter does not draw more power than is available from the input power source and that sufficient power is available to the processing system.

An additional function of the power mode indication provided by power controller 312 is the use in selection of a voltage threshold to trigger a safe shutdown of the system, as discussed in greater detail below with respect to FIG. 4. Still other functions in smart speaker 300 may be based on the power mode. As indicated, power mode 322 may be provided to an audio tuning block 323 that provides an input into processor 342. Depending on the available voltage and power from the source, it may be desirable to enable, disable, and/or modify certain functions and parameters of the smart speaker 300. For example, available power levels may affect the performance of audio amplifier 392 and speaker 394 in reproducing audio. Thus, depending on the available power level, processor 342 may be configured to modify its digital signal processor (DSP) performance or operating parameters to compensate for or take advantage of these differences in audio performance as appropriate. In other words, processor 342 may be configured to determine various audio tuning parameters in response to the determined power mode so as to achieve optimal audio performance without drawing to much power from the input and causing a brownout or shutdown condition.

FIG. 5 illustrates a control technique 500 that may be performed by the smart speaker as described above with respect to FIG. 3. The control technique includes getting a power mode in block 502, which may be performed by power controller 112. This power mode may include a nominal input voltage, an available current, a corresponding power level, and other relevant power parameters. Based on this power mode, one or more control components of the smart speaker may determine a shutdown voltage threshold (block 504) and shutdown the system if the voltage falls below this threshold (block 506). An exemplary shutdown technique is described below with respect to FIGS. 4 and 6. Also based on the power mode, one or more control components of the smart speaker may determine a current limit (selected to prevent drawing too much power from the power source and the resulting brownout of the system) in block 508. Then, one or more control components may operate a converter, e.g., boost converter 116, in accordance with the current limit (block 510). Additionally, one or more control components may set audio parameters (block 512) selected so as to optimize audio performance for a given power mode, and the system may operate the audio system as per these parameters (block 514).

Figure 4:
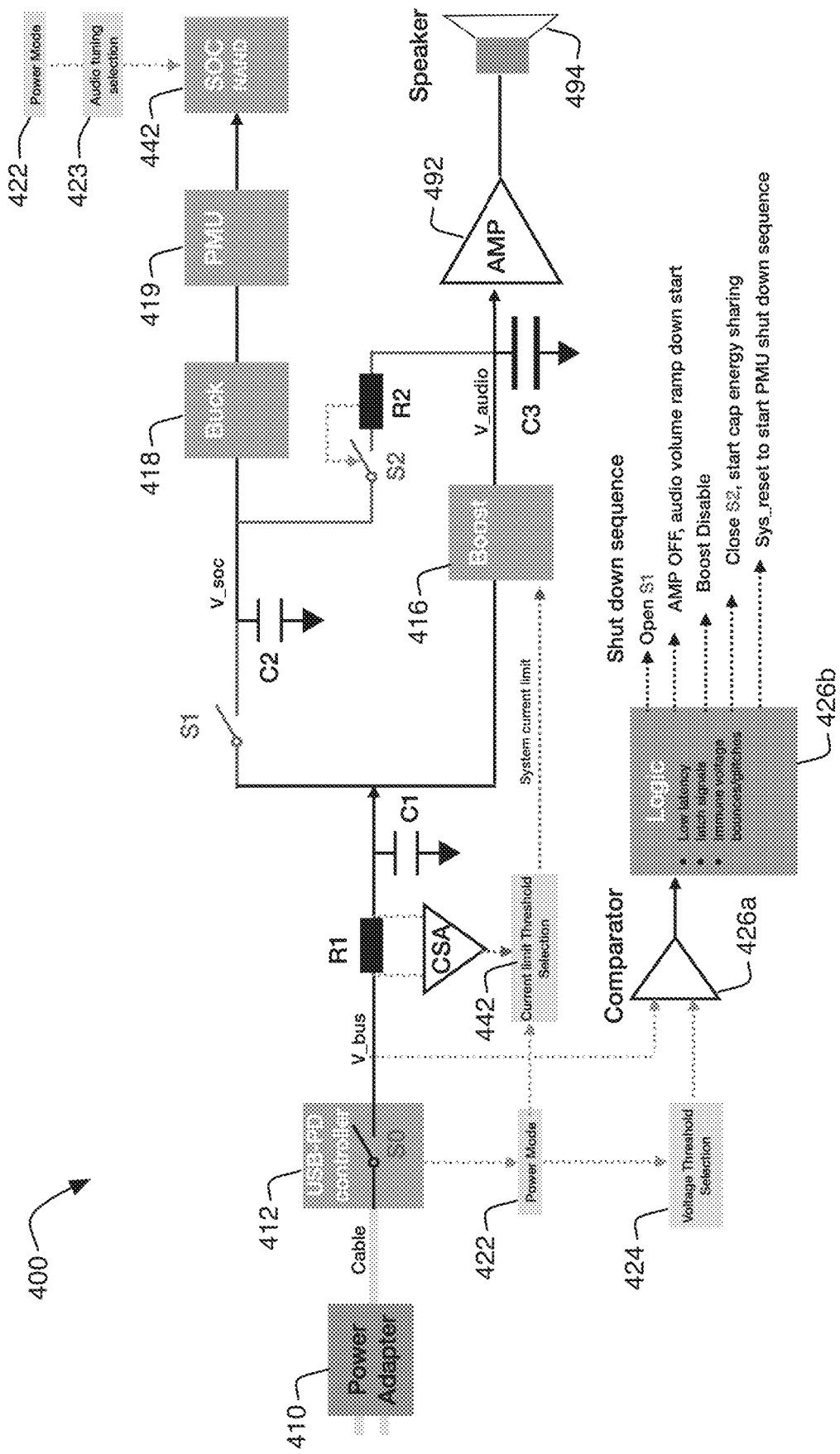
FIG. 4 illustrates an expanded block diagram of a smart speaker system extended holdup time achieved by connecting the audio power bus to the processing system power bus to allow for clean shutdown of the system.

FIG. 4 is a block diagram of smart speaker 400. FIG. 4 generally corresponds to FIGS. 2 and 3 discussed above and uses corresponding reference numbers for corresponding components. FIG. 4 provides context for discussing an exemplary shutdown sequence for the smart speaker system. As noted above, power controller 412 may indicate a power mode 422 (based on negotiation with the power source, e.g., power adapter 410). This power mode may be sued to provide a voltage threshold (lower than the nominal supply voltage) that can be used to trigger a safe shutdown of the smart speaker system. This so-called "safe" shutdown may include multiple aspects. For example, it may include providing a controlled shutdown of processor 442 that can prevent memory corruption associated with a loss of power while the system is operating. The safe shutdown may also include a controlled de-powering of the audio system, particularly amplifier(s) 492 to prevent popping or other undesirable audio effects that can result from sudden depowering of audio amplifiers.

The shutdown voltage threshold may be determined by a control block 424, which may be part of the power controller 412, part of separate control logic, part of the PMU 419, part of the processor 442, or part of any other suitable controller that is a part of smart speaker 400. The shutdown voltage threshold selection logic 424 may take the power mode 442 provided by power controller 412 (which will include a nominal supply voltage) and determine a suitable voltage below the nominal supply voltage that still allows for a controlled shutdown of the system. For example, if the power mode corresponds to a 5V input voltage level, the shutdown voltage may be selected as 3.6V, which still allows for suitable operation of processing system buck converter 418 and a controlled shutdown of processor 442. Similarly, for a power mode corresponding to a 9V input, the shutdown voltage may be selected as around 7V. The exact threshold voltages selected may depend on various design and implementation details of the system.

The shutdown voltage threshold determined by voltage threshold selection logic may be provided to the shutdown controller 126 (FIG. 2), expanded in FIG. 4 to show a comparator 426a and shutdown logic 426b. More specifically, the shutdown voltage threshold may be provided to one input of comparator 426a, with the input voltage (V_bus) being provided to the other input of comparator 426a. If the input voltage falls below the shutdown threshold, the output of comparator 426a may trigger shutdown logic 426b. Shutdown logic 426b may also be implemented in a variety of ways, including as a separate programmable controller (including a one-time programmable controller or a programmable microcontroller or other processor). In other embodiments, the shutdown logic could be integrated with power controller 412 or could be provided as part of power management unit 419 or processor 442. In all cases, the shutdown logic may be configured to provide a safe or controlled shutdown of the smart speaker 400.

To facilitate the safe shutdown, smart speaker 400 may be configured to share energy between the audio system power bus (V_audio) and the processing system power bus (V_soc). In normal operation, the input power bus (V_bus) may be supported by a relatively small capacitance filter capacitor C1. This input power bus may then power the processing system bus (V_soc), which may also be supported by a relatively small capacitance filter/bus capacitor C2. In some embodiments, capacitor C1 may be omitted with a larger capacitance value for C2 may be used. Additionally, input power bus V_bus may be coupled to the input of boost converter 416, which can provide a higher voltage to the audio system bus (V_audio). Audio bus V_audio may be supported by a relatively larger (higher capacitance) capacitor C3, which can provide energy storage necessary to provide adequate power output for large transient audio events. Because of the relatively larger capacitance of audio bus capacitor (relative to the capacitors C1 and C2 supporting the input and processing system busses), and because of the higher voltage of the audio bus relative to the input and processing busses, there is much more energy stored in capacitor C3. The illustrated arrangement allows this energy to be used to achieve safe shutdown.

As illustrated, the power path including switch S2 and resistor R2 can connect the audio bus to the processing bus. Switch 2 may be a semiconductor switching device, such as a transistor (BJT, IGBT, FET, JFET, MOSFET, etc.), thyristor (SCR), etc. In some embodiments, switch S2 could also be a relay or other controlled mechanical switching device. In normal operation, switch S2 is opened, preventing power flow between the two busses. Also, switch S1, coupling the processing system bus V_soc to the input bus V_bus is closed, providing the normal power flow path. Like S2, switch S1 may be a semiconductor switching device, such as a transistor (BJT, IGBT, FET, JFET, MOSFET, etc.), thyristor (SCR), etc. In the event of a power failure, indicated by the input voltage falling below the selected shutdown voltage threshold, switch S2 may be closed, allowing energy stored in audio capacitor C3 to be used to power processor 442 during the shutdown process. However, to prevent back feeding the input, switch S1 may be opened to decouple the processing system bus (V_soc) from the input power bus (V_bus). In fact, switch S1 should be opened slightly before switch S2 is closed, preventing back feeding (which would also correspond to short circuiting boost converter 416).

Thus, when the input voltage falls below the voltage threshold corresponding to the operating power mode, shutdown logic 426b may: (1) cause switch S1 to open, disconnecting the processing system bus V_soc from the input power bus V_bus. Substantially contemporaneously therewith shutdown logic 426b may turn off audio amplifier(s) 492. By "substantially contemporaneously" it is meant that the shutdown of the audio amplifier takes place at about the same time as opening of switch S1. In actual operation, the exact timing between these two events is not critical, and the shutdown of the audio amplifier may begin and/or take place slightly before switch S1 is opened, while switch S1 is opening, or shortly after switch S1 is opened. In some embodiments, it may be preferable for switch S1 to be opened before turning off audio amplifier(s) 492. Turning off the audio amplifiers stops the largest power draw from audio bus capacitor C3, ensuring that the energy stored therein is available to achieve a controlled shutdown of processor 442. In some embodiments, turning off audio amplifier(s) 492 may be done as a controlled audio volume ramp down rather than an abrupt shutoff, to prevent undesirable audio artifacts that may be associated with simply instantaneously cutting power to the amplifiers.

Also substantially contemporaneously with the opening of switch S1, boost converter 416 may be disabled. By "substantially contemporaneously" it is meant that the shutdown of boost converter 416 takes place at about the same time as opening of switch S1. In actual operation, the exact timing between these two events is not critical, and the shutdown of the audio amplifier may begin and/or take place slightly before switch S1 is opened, while switch S1 is opening, or shortly after switch S1 is opened. In some embodiments, it may be preferable for switch S1 to be opened before boost converter 416 is disabled. Additionally, in some embodiments it may be preferable for the audio amplifier to begin or even complete its shutdown before boost converter 416 is disabled, as this can provide allow any residual energy stored in capacitor C1 to also be used for the controlled shutdown process.

Following the opening of switch S1, switch S2 may be closed, coupling the audio bus V_audio to the processing system bus V_soc. To prevent cross conduction to the input, switch S2 cannot be closed until switch S1 is opened. Also, it may be desirable in some embodiments for the closing of switch S2 to follow the disabling of audio amplifier(s) 492 and boost converter 416, although these events may also be substantially contemporaneous. Resistor R2 may be provided in series with switch S2 to limit the current delivered from the audio system bus (i.e., capacitor C3) to the processing system bus. Because these busses normally operate at significantly different voltages, instantaneously directly connecting them would result in an extremely large and potentially damaging current flow between them. In some embodiments, R2 may be a simple current limiting resistor, with switch S2 fully opened to allow as much current flow as R2 will permit. In other embodiments, resistor R2 may be used to control the current through switch S2, for example by operating a transistor-based S2 in its active region. In some embodiments, switch S2 could be part of a buck converter, stepping down the audio bus voltage as appropriate for the processing system bus.

In any case, closing switch S2 allows energy sharing between the audio system bus and the processing system bus and can provide for controlled shutdown of processor 442. To that end, control logic may also provide a reset signal to PMU 419 and/or to processor 442 to initiate shutdown of the processing system. The exact timing of the shutdown signal can vary depending on the embodiment. In some embodiments, it could start as soon as an input voltage below the shutdown voltage threshold is detected. In other embodiments it could take place after all of the events described above.

FIG. 6 illustrates a flow chart 600 for the shutdown sequence described above. The process depicted in the flow chart may be implemented by the shutdown controller 126, which may be implemented by any of the various circuit configuration described above. To begin, the shutdown controller gets the current power mode, e.g., from power controller 112, which includes the nominal input voltage. From the power mode, shutdown controller 126 can determine a shutdown threshold voltage, which may be less than the nominal input voltage but sufficiently high to allow for a controlled shutdown of the system. Shutdown controller 126 can compare the input voltage to the selected threshold. If the input voltage is above the threshold, flow may return to block 602. Otherwise, if the input voltage is less than the threshold voltage, the shutdown process may be initiated. The shutdown process may include:

Block 608: disconnecting the processor bus (i.e., opening switch S1);
Block 610: shutting down the audio amplifier(s) (which may include a soft shutdown to prevent undesirable audio artifacts);
Block 612: shutting down the boost converter;
Block 614: connecting the audio bus to the processor bus (i.e., closing switch S2);
Block 616: initiating shutdown of the processing system.

As noted above, except for ensuring that the audio bus is not connected to the processor bus before the processor bus is disconnected from the input bus (to prevent back feeding the input), the exact timing and sequencing of these events may vary slightly depending on the particulars of a given embodiment.

In addition or as an alternative to the foregoing, a smart speaker system may be configured to regulate the audio bus voltage to minimize wasted energy when large transient audio performance is not required while providing sufficient energy to accurately produce such audio transients when needed. More specifically, in audio systems the power supply voltage to the audio amplifiers may be set as a tradeoff between the overall power consumption of the system and the fidelity of the system in reproducing large audio transients, i.e., signals in which the audio energy increases rapidly, such as a louder passage, deep bass note, etc. The higher the audio bus voltage, the more energy will be stored in the capacitors supporting the bus, and the better the ability to suitably reproduce such audio transients. However, this higher voltage results in higher quiescent currents for all components of the audio power chain, such as amplifiers, power supplies, leakage currents, etc. Reducing these quiescent currents can improve both the overall efficiency of the system as well as the thermal properties of the system. Specifically, the thermal properties may be a significant consideration when packaging a smart speaker system, as it may be desirable to have the system in a relatively small package, which can have undesirable heating effects unless efficiency is optimized.

Figure 7:
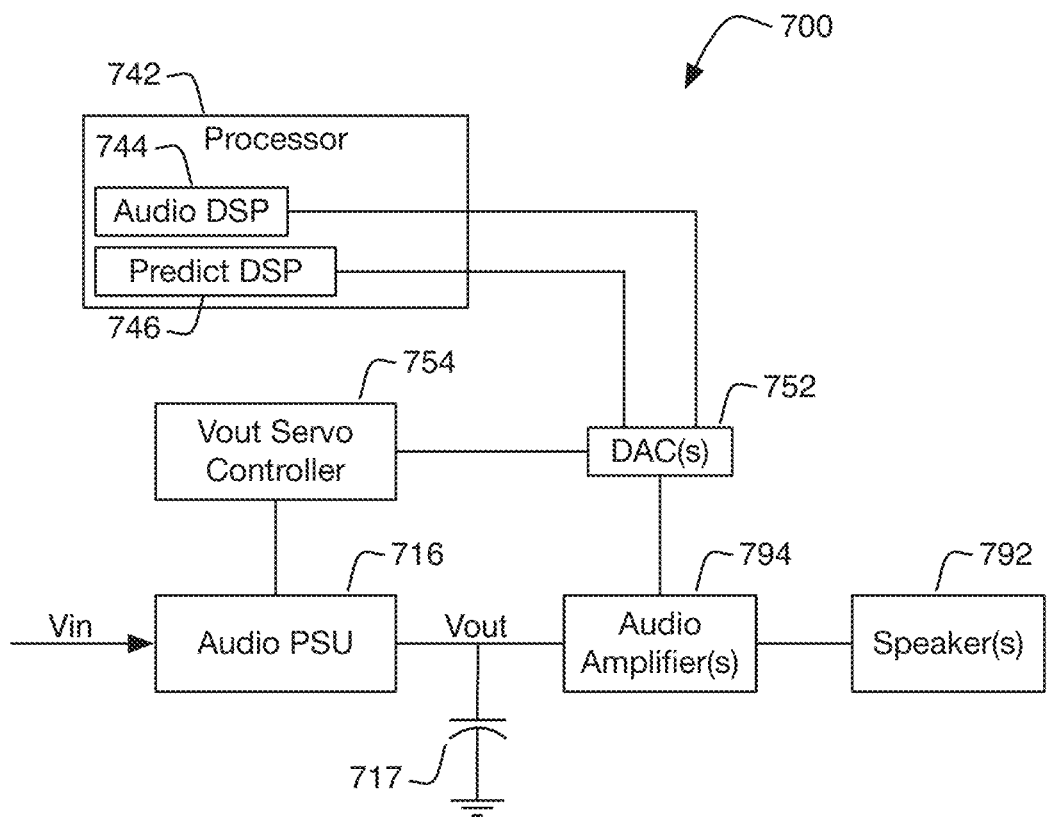
FIG. 7 illustrates a simplified block diagram of a smart speaker with audio power supply output voltage servoing based on upcoming audio signal energy.

Thus, in some embodiments, it may be desirable to servo the audio bus voltage to a lower value to achieve lower quiescent currents when significant audio transient loads are not expected. Conversely, when higher audio transients are expected, the audio voltage may be served to a higher value to suitably reproduce these audio events. A simplified block diagram of an exemplary smart speaker system 700 along these lines is illustrated in block diagram form in FIG. 7. In general, reference numbers shown correspond to components discussed above with respect to FIGS. 2-4, with certain components omitted for clarity in the present discussion.

As described above, smart speaker system 700 can include a processor 742 that provides an audio output signal for the system. As an example, processor may retrieve an encoded audio file from a storage or memory (not shown). The storage/memory may be implemented as part of a system on a chip including processor 742 or may be part of a separate module. The encoded audio file may be encoded with a lossy or lossless compression. In either case, processor 742 may include at least one digital signal processor (DSP) configured to decode the encoded audio file to produce an audio bitstream. As described in greater detail below, the at least one DSP can include a single audio DSP 744 that can be configured to provide the audio to both the audio system and the output voltage servo controller 754 via one or more digital to analog converters (DACs) 752. Alternatively, the at least one DSP can include dual audio DSPs, including an audio DSP 744 that provides the audio signal to be reproduced by the amplifier/speaker system and a prediction DSP 746 that provides an input to the output voltage servo controller 754 via the one or more DACs 752. In cases where a separate prediction DSP is used, it may be configured as a simpler, less complex, less expensive DSP, as the full audio fidelity may not be required for output voltage servoing described below. In still other cases, the output voltage servo controller 754 could be configured to receive the output audio bitstream directly from the DSP and process it accordingly, without the intervening digital to analog conversion. This arrangement is not shown in FIG. 7, but those skilled in the art will appreciate the interconnections of such a system.

As noted above, the audio bitstream from at least DSP 744 may be provided to a digital to analog converter 752. This DAC can be configured to convert the digital audio bitstream into an analog signal that can be provided to audio amplifier(s) 794, for amplification and output via loudspeaker(s) 792. In some embodiments, DAC 752 may also provide the output audio signal to output voltage servo controller 754, for use in controlling the output voltage responsive to the audio signal—more specifically to increase the audio bus voltage Vout when large audio signals (i.e., high energy audio signals) are to be reproduced and to decrease the audio bus voltage Vout when such large signal reproduction is not required. As described above, this can improve efficiency and thermal performance of the system when large audio signal reproduction is not needed. Depending on the specific design implementation of a given system, DAC 752 may be a single DAC configured to provide an analog audio signal to audio amplifier(s) 794 and a corresponding analog signal to output voltage servo controller 754. In other embodiments, DAC 752 may include separate DACs for the audio output and the output voltage servoing arrangement. In this latter case, the audio output DAC may be a higher resolution DAC than that used for the output voltage servo control, as the output voltage servoing does not need the same fidelity of audio signal reproduction as the audio output system.

Output voltage servo controller may be configured to receive a representation of the audio output and regulate audio power supply 716 (which may, for example correspond to boost converter 116, discussed above) to produce an output voltage appropriate to the present and imminently expected audio signal reproduction requirements. In other words, when relatively little energy is required to satisfactorily reproduce the present and imminently expected audio signal, the output voltage may be controlled to a lower level that reduces quiescent current requirements and thereby improves overall operating efficiency and thermal loading. Alternatively, when relatively higher energy is required to satisfactorily reproduce the present and imminently expected audio signal, the output voltage may be controlled to a higher level that increases quiescent current, thereby decreasing overall operating efficiency and thermal loading, but providing improved audio reproduction fidelity.

To provide sufficient time for the servo controller to set the audio PSU output voltage and for the power supply to respond, there should be a sufficient look ahead time as compared to the audio output waveform. This look ahead time (discussed in greater detail below with reference to FIG. 8) may be provided in a number of ways. In some embodiments, prediction DSP may be running slightly ahead of audio DSP 744 in the encoded audio file. In other embodiments, such as those using a single DSP, a delay may be provided in the signal destined for the audio amplifier, while the non-delayed signal may be provided to the output voltage servo controller 754.

The output voltage servo controller 754 may be implemented in a variety of fashions. In some embodiments, it may be integrated with the processor 742. In other embodiments, it may be provided by a separate controller, implemented as a programmable controller, microprocessor, application specific integrated circuit (ASIC), etc. Alternatively, output voltage servo controller 754 could be implemented as an analog control loop. In still other embodiments, output voltage servo controller 754 could be implemented as part of the controller for power supply 716, either in digital, analog, or hybrid digital-analog form.

As was described above an audio power supply 716 may provide the power required to operate the audio system, including audio amplifier(s) 794 that drive output loudspeaker(s) 792. In some embodiments, this may be a boost converter that boosts the input voltage to a level higher than the received input voltage (Vin), as was described above. In other embodiments, other power supply topologies, including various other switching power supply types or linear power regulators could be used. In any case, the audio power supply unit may be controlled by output voltage servo controller 754 to increase or its output voltage (Vout) as described above. This output voltage (Vout) may be supported by audio capacitor 717 (corresponding to capacitor C3 discussed above), which may be a relatively large capacitance capacitor to provide adequate energy storage to achieve the desired level of audio performance (and also as a hold-up time extender for the processor circuitry as described above with respect to FIGS. 4 and 6).

Figure 8:
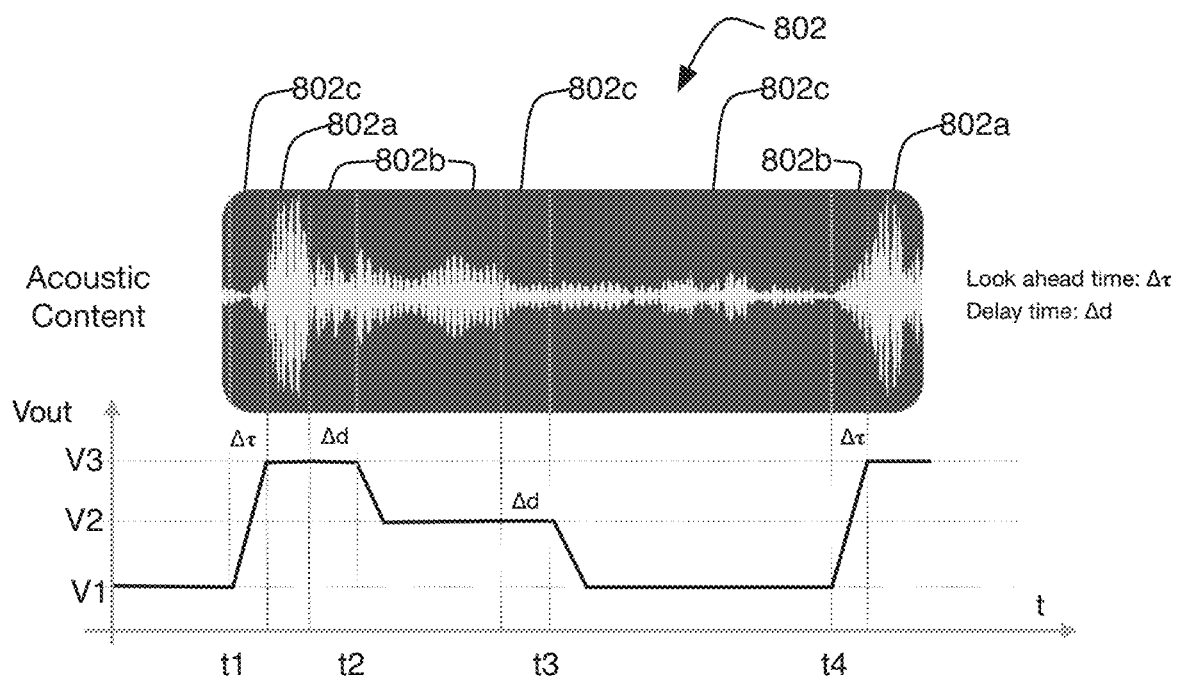
FIG. 8 illustrates an audio signal with various energy levels and corresponding output voltage servoing of the audio power supply.

FIG. 8 illustrates an exemplary audio output waveform 802, having a various high energy section 802a, medium energy sections 802b, and low energy sections 802c. FIG. 8 further illustrates the corresponding servoing of output voltage Vout corresponding to the audio signals. More specifically, prior to time t1, the acoustic content 802 is a relatively low energy region 802c. Thus, the output voltage Vout of audio PSU 716 is served to a relatively low level V1. At time t1, which is a look ahead time M before the beginning of high energy region 802a, output voltage servo controller 754 may see the increased audio energy requirement and increase the output voltage Vout of audio PSU 716 to a high level V3. Once the audio energy reduces to a medium energy region 802b, the output voltage servo controller may wait a delay time Δd before lowering the output voltage to an intermediate level V2 at time t2. Likewise, once the audio signal transitions to a low energy level region 802c, the output voltage servo controller may again wait a delay time Δd before transitioning back to the lower output voltage V1 at time t3. When the audio signal transitions to a high energy region 802a the system may again increase the voltage a lookahead time M before the increased audio signal level (time t4). The voltage servoing may be based on any number of output voltage levels (greater than 2) corresponding to an equal number of audio levels. Likewise, the look ahead time before an audio signal energy transition may vary depending on the size of the transition, for example, with higher increases allowing longer time for the transition. Similarly, the delay before reducing the output voltage may also correspond to the audio signal energy reduction and corresponding voltage reduction.

Figure 9:
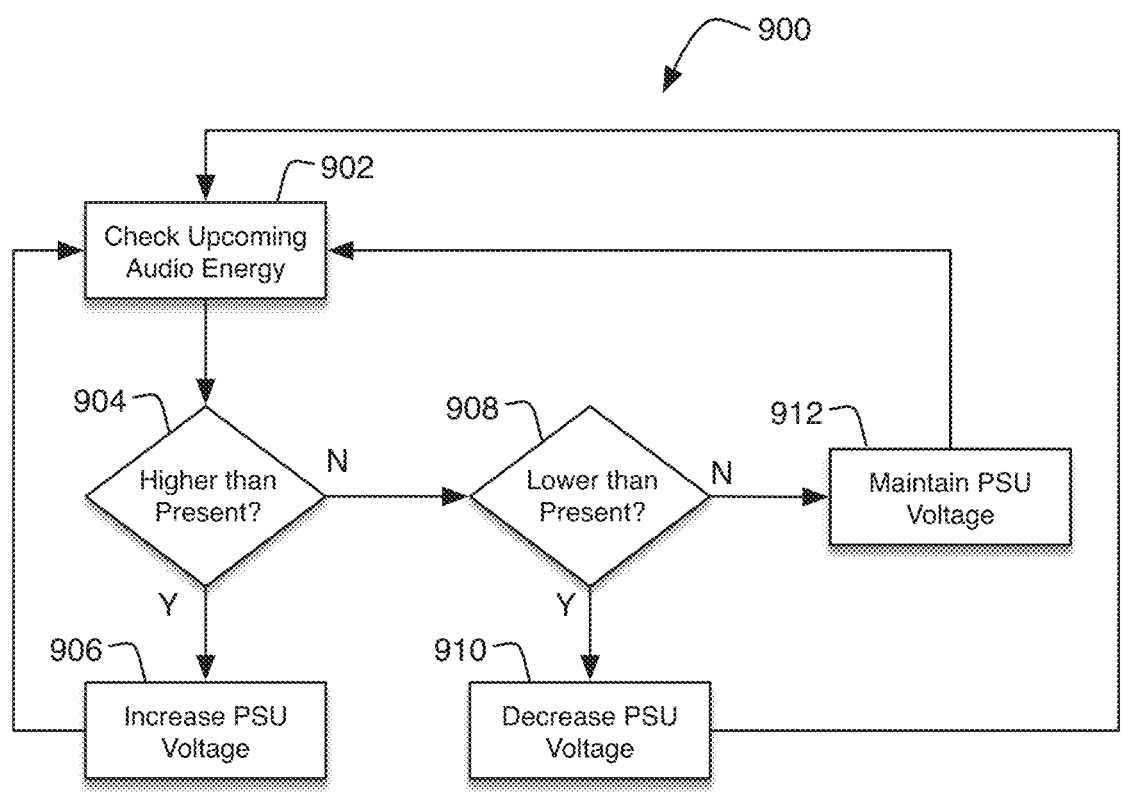
FIG. 9 illustrates a flow chart of an audio power supply output voltage servoing technique based on audio signal energy level.

FIG. 9 illustrates a flow chart of an output voltage servoing control technique 900 that may be implemented by output voltage servo controller 754. Beginning at block 902, the servo controller may check the upcoming audio energy that is to be reproduced. As described above this can be received from a DSP decoding a stored audio signal, a DAC, or other suitable source. If the upcoming audio energy is more than a predetermined threshold greater than the present audio energy (block 904), then the output voltage of the audio power supply may be increased (block 906), and the servo controller may continue checking the upcoming audio energy. If not, i.e., if the upcoming audio energy is not higher than the present energy level by more than a predetermined threshold, the controller may determine whether the upcoming audio energy is less than the present audio energy by more than a predetermined threshold (block 908). If so, the controller can decrease the audio power supply voltage (block 910), and continue checking the upcoming audio energy. If not, the controller can maintain the audio power supply voltage at its present level (block 912) and continue checking the upcoming audio energy. As describe above, the increases in audio energy and corresponding power supply voltage may be in any number of steps.

The foregoing embodiments of smart speaker systems include various power management techniques for such systems, including: (1) adapting operation of various smart speaker components based on the power mode of an input power source, (2) providing extended holdup time in the event of power loss to allow for clean shutdown of the system, and (3) changing the output voltage of an audio power supply based on the energy requirements to suitably reproduce the upcoming audio signal. Although described separately, various combinations of some or all of these features is also possible. Each embodiment may have further advantages and disadvantages rendering it more suitable or less suitable for a given application.

Additionally, although the foregoing embodiments have been described with respect to smart speaker systems, it will be appreciated that the teachings herein may be extended to other suitable electronic systems and devices. Although numerous specific features and various embodiments have been described, it is to be understood that, unless otherwise noted as being mutually exclusive, the various features and embodiments may be combined various permutations in a particular implementation. Thus, the various embodiments described above are provided by way of illustration only and should not be constructed to limit the scope of the disclosure. Various modifications and changes can be made to the principles and embodiments herein without departing from the scope of the disclosure and without departing from the scope of the claims.

The invention claimed is:

1. A smart speaker system comprising:
a power controller configured to receive power from an input power source, wherein the received power conforms to one of a plurality of power modes;
a processing system configured to receive power from the power controller via a processing system power bus; and
an audio system configured to receive power from the power controller via an audio system power bus;
wherein:
the power controller is configured to communicate the power mode of the incoming power to at least one component of the processing system or at least one component of the audio system; and
the power controller is configured to communicate the power mode to a shutdown voltage threshold selector configured to determine a shutdown voltage threshold in accordance with the power mode of the incoming power, wherein the shutdown voltage threshold is provided to a shutdown controller configured to safely shut down the smart speaker system if the input power falls below the shutdown voltage threshold.

2. The smart speaker system of claim 1 wherein the power controller is configured to communicate the power mode to a current limit selector configured to determine a current limit in accordance with the power mode of the incoming power and limit current of a power converter in accordance with the determined current limit.

3. The smart speaker system of claim 2 wherein the power converter is configured to convert input power to power the audio system.

4. The smart speaker system of claim 3 wherein the power converter is a boost converter.

5. The smart speaker system of claim 1 further comprising:
a first switching device configured to selectively couple and decouple the processing system power bus from the input power source; and
a second switching device configured to selectively couple and decouple the audio system power bus to the processing system power bus;
wherein responsive to an input voltage below the shutdown voltage threshold, the shutdown controller is configured to open the first switching device, thereby decoupling the processing system power bus from the input power source and close the second switching device, thereby coupling the processing system power bus to the audio system power bus and allowing energy stored in an audio bus capacitor to provide for safe shutdown of the processing system.

6. The smart speaker system of claim 5 wherein, responsive to the input voltage below the shutdown voltage threshold, the shutdown controller is further configured to perform at least one of:
disabling an audio amplifier of the audio system;
disabling a power converter powering the audio system; and
sending a shutdown signal to the processing system.

7. The smart speaker system of claim 1 wherein the power controller is configured to communicate the power mode of the incoming power to the processing system, and wherein the processing system is configured to modify operation of the smart speaker system in response to the power mode.

8. The smart speaker system of claim 7 wherein the processing system is configured to modify operation of the smart speaker system in response to the power mode by modifying audio performance of the smart speaker system.

9. A smart speaker system comprising:
a power controller configured to receive power from an input power source, wherein the received power conforms to one of a plurality of power modes;
a processing system configured to receive power from the power controller via a processing system power bus; and
an audio system configured to receive power from the power controller via an audio system power bus;
wherein:

the power controller is configured to communicate the power mode of the incoming power to at least one component of the processing system or at least one component of the audio system; and the power controller is configured to communicate the power mode to a current limit selector configured to determine a current limit in accordance with the power mode of the incoming power and limit current of a power converter in accordance with the determined current limit.

10. The smart speaker system of claim 9 wherein the power converter is configured to convert input power to power the audio system.

11. The smart speaker system of claim 10 wherein the power converter is a boost converter.

12. The smart speaker system of claim 9 wherein the power controller is configured to communicate the power mode to a shutdown voltage threshold selector configured to determine a shutdown voltage threshold in accordance with the power mode of the incoming power, wherein the shutdown voltage threshold is provided to a shutdown controller configured to safely shut down the smart speaker system if the input power falls below the shutdown voltage threshold.

13. The smart speaker system of claim 12 further comprising:

a first switching device configured to selectively couple and decouple the processing system power bus from the input power source; and a second switching device configured to selectively couple and decouple the audio system power bus to the processing system power bus;

wherein responsive to an input voltage below the shutdown voltage threshold, the shutdown controller is configured to open the first switching device, thereby decoupling the processing system power bus from the input power source and close the second switching device, thereby coupling the processing system power bus to the audio system power bus and allowing energy stored in an audio bus capacitor to provide for safe shutdown of the processing system.

14. The smart speaker system of claim 13 wherein, responsive to the input voltage below the shutdown voltage threshold, the shutdown controller is further configured to perform at least one of:

disabling an audio amplifier of the audio system;
disabling a power converter powering the audio system; and
sending a shutdown signal to the processing system.

15. The smart speaker system of claim 9 wherein the power controller is configured to communicate the power mode of the incoming power to the processing system, and wherein the processing system is configured to modify operation of the smart speaker system in response to the power mode.

16. The smart speaker system of claim 15 wherein the processing system is configured to modify operation of the smart speaker system in response to the power mode by modifying audio performance of the smart speaker system.

17. A method of operating a smart speaker, the method comprising:

determining a power mode of input power received by the smart speaker, the power mode including an input voltage and at least one of an available current or an available power; and responsive to the input power mode, performing at least one of:

determining a shutdown voltage threshold corresponding to the input power mode and, responsive to an input voltage below the determined shutdown voltage threshold, performing a safe shutdown of the smart speaker;

determining a current limit corresponding to the input power mode and limiting a current of a power converter based on the determined current limit; or setting one or more audio parameters corresponding to the input power mode and operating an audio system of the smart speaker according to the set audio parameters.

18. The method of claim 17 wherein performing a safe shutdown of the smart speaker further comprises:

opening a first switching device to decouple a processing system power bus from the input power source; and closing a second switching device to couple the processing system power bus to an audio system power bus, thereby allowing energy stored in an audio bus capacitor to provide for safe shutdown of the processing system.

19. The method of claim 18 wherein performing a safe shutdown of the smart speaker further comprises at least one of:

disabling an audio amplifier of the audio system;
disabling a power converter powering the audio system; and
sending a shutdown signal to the processing system.

* * * * *